United States Patent
Berne et al.

(10) Patent No.: US 6,936,523 B2
(45) Date of Patent: Aug. 30, 2005

(54) TWO-STAGE ANNEALING METHOD FOR MANUFACTURING SEMICONDUCTOR SUBSTRATES

(75) Inventors: Cecile Berne, Grenoble (FR); Bruno Ghyselen, Seyssinet-Pariset (FR); Chrystelle Lagahe, St Joseph de Rivière (FR); Thibaut Maurice, Grenoble (FR)

(73) Assignees: S.O.I.Tec Silicon on Insulator Technologies S.A., Bernin (FR); Commisariat à l'énergie Atomique (CEA), Paris (FR)

(*) Notice: Subject to any disclaimer, the term of this patent is extended or adjusted under 35 U.S.C. 154(b) by 78 days.

(21) Appl. No.: 10/733,431

(22) Filed: Dec. 10, 2003

(65) Prior Publication Data

US 2004/0161904 A1 Aug. 19, 2004

Related U.S. Application Data

(60) Provisional application No. 60/472,468, filed on May 22, 2003.

(30) Foreign Application Priority Data

Dec. 10, 2002 (EP) .............................................. 02293049
Nov. 20, 2003 (EP) .............................................. 03292888

(51) Int. Cl.[7] .............................................. H01L 21/46
(52) U.S. Cl. .................................................... 438/458
(58) Field of Search ................................ 438/455, 458

(56) References Cited

U.S. PATENT DOCUMENTS

| | | | |
|---|---|---|---|
| 5,877,070 A | 3/1999 | Goesele et al. | 438/458 |
| 6,303,468 B1 | 10/2001 | Aspar et al. | 438/455 |
| 6,632,724 B2 * | 10/2003 | Henley et al. | 438/455 |
| 6,828,216 B2 * | 12/2004 | Schwarzenbach et al. | 438/458 |
| 6,838,358 B2 * | 1/2005 | Maurice et al. | 438/458 |

FOREIGN PATENT DOCUMENTS

FR 2767416 2/1999

OTHER PUBLICATIONS

A.J. Auberton–Herve, "SOI: Materials to Systems," 1996 IEEE IEDM, pp. 3–10.*
Q.Y. Tong et al., "Low Temperature Si Layer Splitting," Oct. 1997, Proceedings of the 1997 IEEE International SOI Conference, pp. 126–127.*
U. Gosele, "Semiconductor wafer bonding: A flexible approach to materials combinations in microelectronics; micromechanics and optoelectronics," Oct. 1997, IEEE CAS '97 Proceedings, vol. 1, pp. 23–32.*
B. Aspar et al: XP001050558 "The Generic Nature Of The Smart–Cut Process For Thin Film Transfer", Journal Of Electronic Materials, vol. 30, No. 7, 22 , pp. 834–840, (2001).
B. Aspar et al: XP000884996, "Smart–Cut Technology: An Industrial Application Of Ion Implementation Induced Cavities", Materials Research Society Symposium Proceedings, Materials Research Society, vol. 510, No. 13, pp 381–393 (19998).

* cited by examiner

Primary Examiner—Evan Pert
(74) Attorney, Agent, or Firm—Winston & Strawn LLP

(57) ABSTRACT

The present invention relates to a method for manufacturing a heterogeneous material structure. The method includes forming a predetermined detachment area in a source substrate, and bonding the source substrate to a handle substrate to form a source-handle structure. The source-handle-structure is then annealed at a first energy level that is lower than the energy of a thermal detachment budget and stopping before detachment of the source substrate. Lastly, the source-handle-structure is annealed at a second energy level that is lower than the first energy level at least until the substrate detaches at the predetermined detachment area.

23 Claims, 3 Drawing Sheets

TWO-STAGE ANNEALING METHOD FOR MANUFACTURING SEMICONDUCTOR SUBSTRATES

This application claims the benefit of U.S. provisional application No. 60/472,468 filed May 22, 2003.

BACKGROUND ART

The present invention relates to a method for manufacturing semiconductor structures of heterogeneous, non-heterogeneous or homogenous materials and in particular, for silicon containing or silicon-on-insulator ("SOI") structures. The method includes thermally annealing a source-handle-structure by using first and second annealing steps. The first annealing step is stopped before detachment of the source substrate, and the second annealing step is then performed at a lower temperature than the first annealing step to prepare the source substrate for detachment of a useful layer at the predetermined detachment area.

Heterogeneous material compounds or structures such as heterostructures, particularly those consisting of a thin layer of a semiconductor material attached to a handle substrate, have attained considerable industry attention as the next generation of micro-device wafers, especially as used in the fields of microelectronics, optoelectronics or micromechanics.

In semiconductor technologies, thin layers are required which are only a few nanometers to a few micrometers thick with a very low thickness variance. Further, there is a major interest in monocrystalline thin layers. A very suitable technique to produce such thin films on a handle substrate is the SMART-CUT® process, offering a favorable way to produce for instance SOI (silicon on insulator) wafers with a high quality at low cost. One process flow to obtain SOI wafers using the SMART-CUT® process is shown schematically in FIGS. 6 and 7.

As shown in FIG. 6, two starting wafers, for instance a source or top silicon wafer 1' and a handle or base silicon wafer 2', are provided. An implantation of gaseous species like hydrogen and/or a rare gas such as helium is then executed to form a predetermined detachment zone 5' at a certain depth d of the top silicon wafer 1'. Instead of an implantation, any other kind of process can be used which is able to introduce the gaseous species into the wafer 1'.

The predetermined detachment zone defines the location within the top wafer 1' where detachment may occur. After implantation, the top wafer 1' is divided in two regions: a thin region 3' whose thickness is determined by the used implantation energy, and the remainder 4' of the top wafer 1'.

In the next step, the thin region 3' of the top wafer 1' is bonded on its implanted surface to the base wafer 2'. Bonding is preferentially achieved by so-called direct wafer bonding based on molecular adhesion; however other bonding techniques such as a method with an intermediate glue layer, anodic bonding or a method with electrostatic treatment assistance can be used instead.

As shown in FIG. 7, the bonded wafer structure of the wafers 1' and 2' is then heated in a furnace 7 to supply energy to the bonded wafer structure, especially to the implanted wafer 1' which includes detachment zone 5' to weaken the structure. A fracture of the source wafer 1' occurs after applying a certain energy to the wafer structure corresponding to a thermal detachment budget wherein a thermal budget is a certain quantity of energy fixed by two parameters: annealing time and annealing temperature. The fracture can be initiated not only thermally, but also by any form of additional energy brought to the wafer compound, such as mechanical energy or acoustic energy.

The thermal detachment budget is a certain thermal budget corresponding to the limit for thermal detaching or cleaving of a material, which is 100% of the necessary energy at which detachment occurs thermally. The temperature-time-dependency of the thermal detachment budget follows Arrhenius Law in which the reciprocal of the annealing time is proportional to the exponent of the reciprocal of the annealing temperature. The budget of thermal detachment of heterogeneous bonded structures is dependent on a number of material, environmental and technological parameters such as the type of material, implantation conditions and bonding conditions.

Then, the remainder 4' of the top wafer 1' can be detached resulting in a SOI-structure 8' having the thin monocrystalline silicon layer 3' transferred onto the silicon base wafer 2'.

According to the above example, both the top wafer 1' and the base wafer 2' are of silicon. When bonded and subsequently heated, almost no stress is created in the wafers.

Heterogeneous bonded structures such as SOQ (silicon on fused silica) compounds or other structures cannot be annealed at such high temperatures as silicon-oxide-silicon compounds to detach the semiconductor material. The difference between the thermal expansion coefficients of e.g. silicon and fused silica and the different temperature dependencies of the thermal expansion coefficients cause, especially during an annealing step, a high thermal stress in the structure.

In non-implanted bonded heterogeneous wafer compounds this stress leads either to an uncontrolled breakage of at least one of the two wafers and/or to a de-bonding of the wafers. When at least one wafer of the heterogeneous bonded wafer compound is implanted such as in the SMART-CUT® process, there is a sudden variation of stress in the heterogeneous wafer structure after the detachment of a remaining part of the implanted wafer when the detachment occurs at a temperature different from the bonding temperature. This can lead to an indefinite breakage of the wafer compound after such a detachment.

To solve this problem, the temperature of the thermal treatment of the heterogeneous wafer structure can be lowered. However, this lowering of temperature must be significant to avoid any indefinite breakage resulting in very long corresponding annealing times in order to achieve the thermal budget necessary for detachment of the implanted wafer. These annealing times are in the range of several days, and are therefore too long for commercial purposes.

Another solution, which has been presented for instance by Aspar et al in the Proceedings of MRS, 1998, uses a high dose hydrogen implantation to facilitate detachment of a wafer of a heterogeneous wafer compound at the implanted area. However, this high dose ion implantation is expensive.

U.S. Pat. No. 6,335,258 describes a method to transfer a thin layer to a heterostructure in which an implanted substrate is thinned down after bonding of this substrate with another substrate to limit a sudden stress variation during detachment of the compound. This method uses an additional processing step and results in significant material consumption because the removed material is lost.

U.S. Pat. No. 6,020,252 discloses a method to detach a structure at lower temperatures using a combination of a heat treatment and mechanical efforts such as traction, shearing or bending forces. Such forces can be applied with a tool a fluid or with another source of mechanical energy, for instance, with a jet as described in U.S. Pat. No. 6,427,748.

U.S. Pat. No. 5,877,070 suggests two specific methods of a SMART-CUT® process to lower a detachment temperature. The first method is based on an additional boron implantation step of the wafer. This method results in disadvantageous boron doping of the surrounding layers and, especially due to the additional implantation step for boron, is expensive and time-consuming. The second method which is of the above-mentioned type, uses pre-annealing before bonding of the wafers. However, the pre-annealing temperature is limited by the effect of blistering of the implanted wafer, resulting in a very fast formation of blisters at the surface of the wafer due to thermal treatment. Blistering occurs quickly with annealing and destroys the flatness of the wafer which is necessary for sufficient bonding of the wafer. After bonding, a second annealing step is done at a low temperature. Due to the limited thermal budget applied during the pre-annealing step, the second annealing step takes several days to reach the thermal budget to detach the implanted wafer.

There is a need for a method which can be easily practiced that has a reduced processing time and a very low risk of damage or destruction of the material while still achieving a high quality detached surface. The present invention now satisfies that need.

SUMMARY OF THE INVENTION

The present invention relates to a method for manufacturing a semiconductor structure comprising providing a predetermined detachment area in a source substrate of a first material, bonding the source substrate to a handle substrate of a second material to form a source-handle-structure; annealing the source-handle-structure in multiple annealing steps. The annealing advantageously includes a first annealing step conducted at a first energy level which is lower than the energy of a thermal detachment budget, and a second annealing step conducted at a second energy level that is lower than the first energy level to at least prepare at least the source substrate for detachment of a useful layer at the predetermined detachment area in order to obtain a layer of first material supported by handle substrate.

The useful layer can be detached at the predetermined detachment area by providing additional energy to the source substrate. The additional energy can be thermal energy provided by further heating of the source substrate, or mechanical energy applied to or near the predetermined detachment area of the source substrate. Acoustic energy can also be used, if desired. Also, the second annealing step may be conducted until detachment occurs at the predetermined detachment area to provide the useful layer on the handle substrate.

The first annealing step is typically conducted to provide a substantial portion of the thermal detachment budget. Generally, the first annealing step includes heating to a temperature of about 350° C. to 500° C. for about a few minutes to about a few hours, and the second annealing step includes heating to a temperature of about 150° C. to 350° C. for about a few hours to about a few days. Preferably, the temperature of the first annealing step is at least 25% greater than that of the second annealing step, and the second annealing step is conducted for at least twice as long as the first annealing step.

The source-handle-structure may be cooled between the first and second annealing steps, either to a temperature of between about 18° C. and 25° C. or to the temperature of the second annealing step. The first annealing step may include step-wise heating or cooling to gradually increase or decrease heating temperature. An advantage of stepwise heating in the first annealing step is that it increases the time necessary to complete that step but decreases the time necessary to complete the second annealing step. The first annealing step can include heating to a maximum temperature followed by step wise cooling to lower temperatures.

The predetermined detachment area is preferably made by implantation of hydrogen or rare gas ions to form a zone of weakness that corresponds to the detachment area. Advantageously, the predetermined detachment area is made by implantation of hydrogen ions, helium ions or a combination of hydrogen and helium ions. After annealing, the layer of first material and handle structure is cooled to room temperature for further processing. The source substrate may or may not be cooled, as desired, and is generally re-used.

The second material of the handle substrate generally is different from the first material of the source substrate. The first and second materials are at least one of silicon, a group (III)-(V) semiconductor, an alloy of a group (III)-(V) semiconductor, silicon germanium, silicon carbide, synthetic quartz or fused silica. The present method can also be used for manufacturing a heterogeneous material structure. Preferably, the first and second materials form or comprise a heterogenous semiconductor structure. For example, the source substrate may be a silicon wafer and the handle substrate a wafer of fused silica or synthetic quartz.

BRIEF DESCRIPTION OF THE DRAWINGS

In FIGS. 1 to 5 the same reference signs as in FIGS. 6 to 7 are used to denote similar or equal components and parts.

DETAILED DESCRIPTION OF THE PREFERRED EMBODIMENTS

Figure 1:
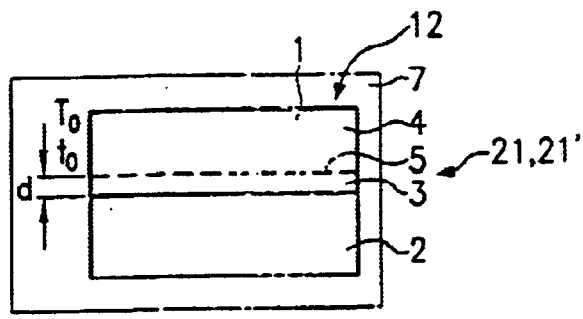
FIG. 1 schematically shows a first annealing step of a method according to a first embodiment of the present invention.

The present invention teaches a method for manufacturing a heterogeneous material structure. The technique includes forming a predetermined detachment area in a source substrate of a first material; attaching the source substrate to a handle substrate of a second, different material to form a source-handle structure, and thermally annealing the source substrate to induce thermal detachment of the source substrate at the predetermined detachment area. Thermal annealing includes a first annealing step of the source-handle-structure. The first annealing step is stopped before detachment of the source substrate. Also included is a second annealing step of the source-handle-structure, after the first annealing step. The second annealing step is performed at a lower temperature than the first annealing step, and continues at least until thermal detachment of the source substrate at the predetermined detachment area.

During the first annealing step, the first material is pre-weakened thermally but not thermally detached at the predetermined detachment area. When the second annealing step starts, some thermal energy has already been introduced in the first material, and a low temperature will then be applied to further weaken the detachment area to facilitate subsequent thermal detachment of the first material at the predetermined detachment area.

The second annealing step therefore applies a thermal energy to the source-handle-structure at a different thermal energy level than that used in the first annealing step. The source substrate can then be detached thermally with a very low risk of destruction occurring during detachment. Accurate detachment occurs at the predetermined detachment area such as an implanted area. The thermal detachment process also avoids further handling of the source-handle-structure for detachment purposes, and therefore reduces the risk of degradation of the substrates that may occur during mechanically assisted detachment, such as those techniques disclosed in U.S. Pat. Nos. 6,020,252 and 6,427,748.

The annealing temperature of the first annealing step can be increased to a relatively high value, which will then shorten the annealing time of the second annealing step resulting in a reduced process time. Detachment can be achieved in a number of ways with the second annealing step. Advantageously, the second annealing step may be continued until detachment of the source substrate occurs. The low temperature of the second annealing step leads to a gentle thermal detachment of the source materials.

It is also beneficial to initiate detachment after the second annealing step by providing additional energy. This way, the process time of the second annealing step can be reduced. In an especially beneficial embodiment, the additional energy is mechanical energy. It has been shown that mechanical energy which is applied after the second annealing step is very effective in providing a final amount of additional energy to split the source-handle-compound. The amount of mechanical energy to be provided is relatively small due to the pre-weakening or pre-fragilization of the detachment area due to the anneal steps.

In a favorable embodiment, the first annealing step is performed at an energy which is lower than the energy of a thermal detachment budget at which the source-handle structure can be detached. In this manner, the first annealing step utilizes an optimum energy applied to the source-handle-structure, which is less than 100% of the thermal detachment budget. This prevents an unintended breakage of the source-handle-structure from occurring, and induces a thermal energy in the source substrate which is high enough to cause a rapid thermal detachment of the source substrate after the second annealing step.

In a further embodiment, the first annealing step is performed at about 70 to 99% of the temperature-time-ratio of the thermal detachment budget. This range is particularly suitable to obtain a reduced processing time for detachment in the second annealing step.

When the source-handle-structure is cooled between the first annealing step and the second annealing step, the method can be divided into two different physical steps. The source-handle-structure may be cooled to room temperature between the first and the second annealing steps, preferably to a temperature of about between 18° C. and 25° C. Use of room temperature requires no further adjustment and allows the easy handling of the wafers between the first and the second annealing steps. Thus, the temperature between the first and the second annealing steps can be below the temperature of the second annealing step.

Alternatively, the source-handle-compound may be cooled to a temperature of the second annealing step between the first and the second annealing steps. This facilitates a change from the first annealing step to the second annealing step and reduces the processing time. For example, the temperature can be directly cooled down from the first step temperature level to the second step temperature level.

In another advantageous embodiment, the first annealing step and/or the second annealing step may be reduced in a step-wise manner to the annealing temperature. This makes it possible to reduce the annealing time in the second annealing step to result in increased productivity.

In a yet further embodiment, the first material and/or the second material is at least one of a group of materials consisting of silicon, a group (III)-(V) semiconductor, an alloy of a group (III)-(V) semiconductor, silicon germanium, silicon carbide, synthetic quartz and fused silica. With these materials, heterogeneous material compounds can be manufactured which cover most of the presently required heterostructures, for instance in the microelectronics, in the optoelectronics or in the micromechanics fields. In addition, the process can be used to produce non-heterogeneous material structures such as SOIs.

According to a yet further advantageous variant, the source substrate is a silicon wafer and the handle substrate is a synthetic quartz wafer. By this method so-called SOQ (silicon-on-fused silica) wafers can be produced. The method can be easily carried out with reduced processing time and a very low risk of damage or destruction of the material to achieve a high quality of the detached surface.

FIG. 1 schematically shows a first annealing step of a first embodiment. A wafer structure 12 includes bonded wafers 1 and 2 is annealed in a furnace 7 which is heated to an annealing temperature $T_0$ for an annealing time $t_0$. Wafer 1 is a source wafer made of silicon while wafer 2 is a handle wafer made of fused silica. In another embodiment, wafers 1 and 2 can be of any other semiconductor, conductor or insulator material used in microelectronics or a similar technical field, such as a group (III)-(V) semiconductor, such as GaAs, InP or GaN, an alloy of a group (III)-(V) semiconductor, silicon germanium, silicon carbide, synthetic quartz and fused silica. Wafer 1 and wafer 2 may be of the same or different materials, as desired for the intended use of the final structures.

Wafer 1 is implanted with hydrogen ions to form a buried, predetermined detachment area 5 having a depth d in wafer 1. The area 5 is shown in FIG. 1 from the front side as a line. Helium ions either alone or in combination with hydrogen ions can be used to form the detachment area. Optionally, the detachment area can be produced by an implantation of other ions, such as boron or phosphor, or by a combination of these ions with hydrogen or helium ions. For certain applications, boron ions should be omitted, for example, to avoid boron doping of the surrounding layers. The ions can also be buried in wafer 1, for instance during wafer manufacturing. The area 5 can also be pre-weakened by a local distortion of the crystal structure or crystallinity of the wafer 1, induced for instance by radiation or a mechanical influence.

Figure 2:
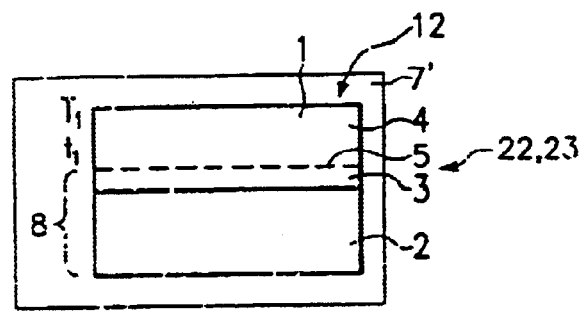
FIG. 2 schematically shows a second annealing step of a method according to the first embodiment of the present invention.

FIG. 2 schematically shows a second annealing step 22 according to a first embodiment where the wafer structure 12 is placed in another furnace 7' and heated up to an annealing temperature $T_1$ for an annealing time $t_1$ at least until detachment of the wafer 1 at the pre-weakened buried detachment area 5. Optionally, to employ the second annealing step, the wafer structure can be left in the first furnace 7.

The resulting heterostructure 8 comprises a thin monocrystalline silicon layer 3 which is attached to the handle wafer 2. The remainder 4 of the wafer 1 can be removed from the heterostructure 8 in one piece.

Figure 3:
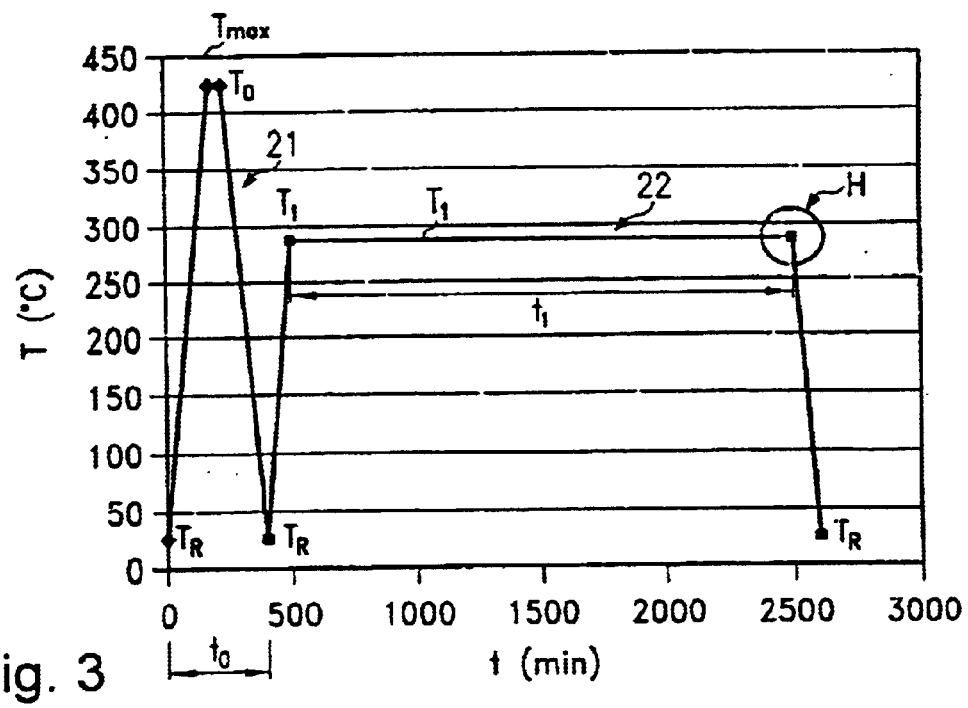
FIG. 3 shows a temperature-time diagram illustrating the temperature-time course during a method according to the first embodiment of the present invention.
Figure 4:
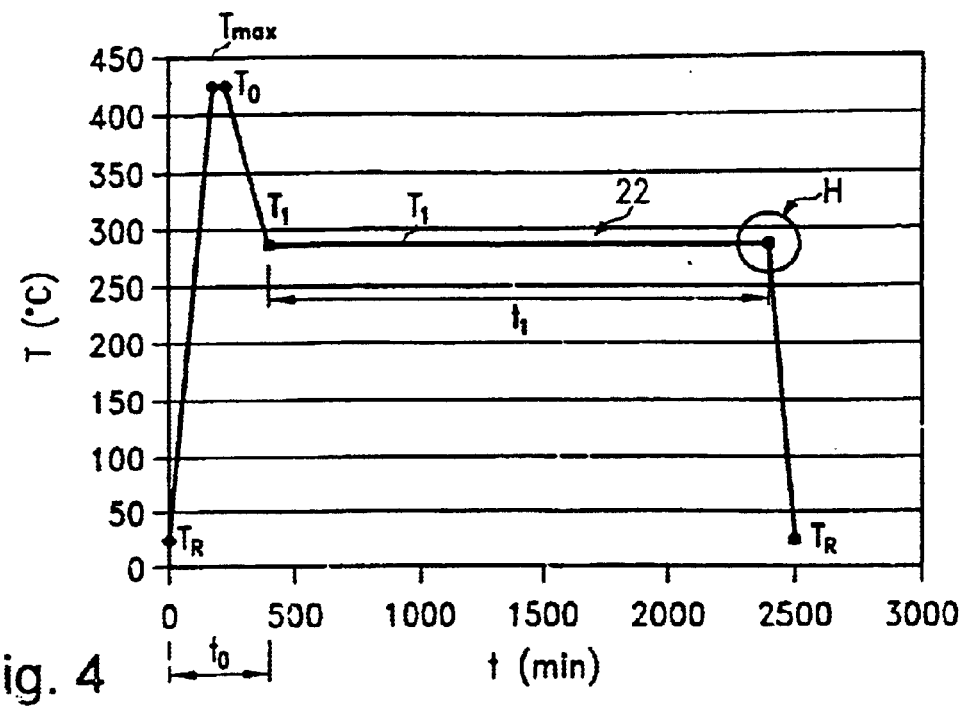
FIG. 4 shows a temperature-time diagram illustrating the temperature-time course during a method according to a second embodiment of the present invention.
Figure 5:
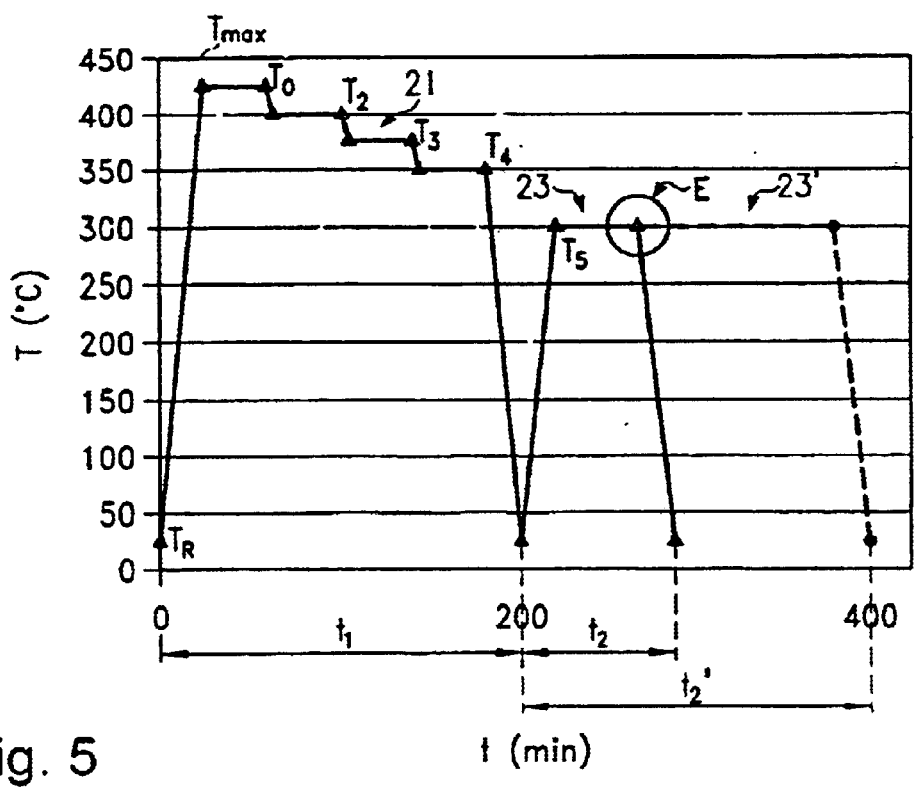
FIG. 5 shows a temperature-time diagram illustrating the temperature-time course during a method according to a third embodiment of the present invention.
Figure 6:
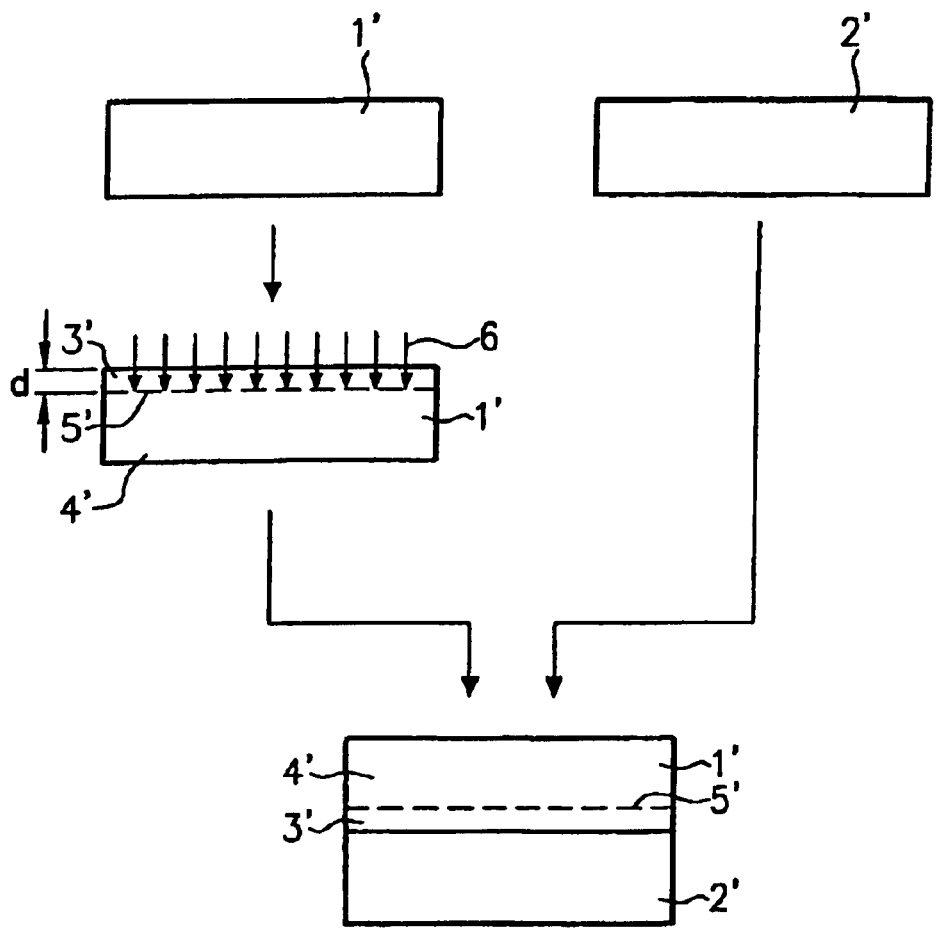
FIG. 6 schematically shows the process preparation steps of a conventional SMART-CUT® process, including oxidation, implantation and wafer bonding.
Figure 7:
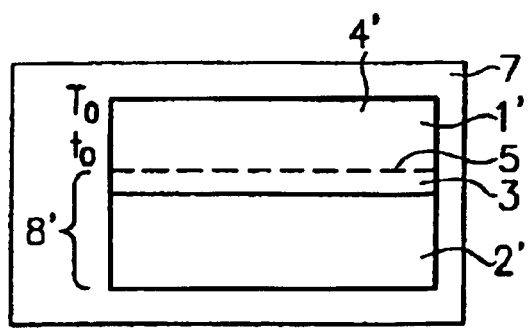
FIG. 7 schematically shows an illustrative arrangement of an annealing step used in the conventional SMART-CUT® process of FIG. 6.

FIGS. 3 to 5 show temperature-time-diagrams illustrating the temperature-time-course according to first, second and third embodiments of the present method. In the embodiments the following process conditions are used:

| | |
|---|---|
| Source substrate: | silicon |
| Handle substrate: | fused silica or silicon |
| Thickness of buried oxide: | about 50 nm to about 1000 nm |
| Energy of implantation: | about 30 keV to about 200 keV |
| Dose of implantation: | about $1 \times 10^{16}$ cm$^{-2}$ to about $1 \times 10^{17}$ cm$^{-2}$ |

Process window of the first annealing step: between about 350° C. to about 500° C., for about a few minutes to about a few hours Process window of the second annealing step: between about 150° C. to about 350° C., for about a few hours to about a few days FIG. 3 shows a temperature-time diagram illustrating the temperature-time course during a method according to a first embodiment in which the temperature is held constant for a period of time during the second annealing step. As shown in FIG. 3, the wafer compound 12 is introduced into the furnace 7 at a room temperature $T_R$ during the first annealing step 21. The room temperature $T_R$ corresponds to a temperature value between about 18° and 25° C. The temperature is then continuously increased up to the annealing temperature $T_0$, which is about 425° C. in the example shown. The temperature is then held at the level of $T_0$ for several minutes. Alternatively, the temperature can be held constant for a longer period of time, such as several hours. Thereafter, the temperature is continuously cooled down to room temperature $T_R$.

In another embodiment, the wafer compound 12 can be introduced into the furnace 7 at different temperatures. The temperature of the furnace 7 can be modified in accordance with the type of furnace and the implantation conditions.

The energy applied to the heterogeneous bonded wafer structure 12 in the first annealing step 21 corresponds to about 90% of the detachment thermal budget of the wafer compound 12 that would result in detachment. The first annealing step 21 causes weakening at the predetermined detachment area, but without detachment of the wafer 1 from the wafer 2 and without affecting the bond of the wafer-compound 12.

In a second annealing step 22, the wafer compound 12 is heated to a temperature $T_1$ and is then held at this temperature for a longer period of time t1, for example about 1800 minutes. At an annealing time and an annealing temperature which is marked by the arrow H, the wafer structure thermally detaches. Thereafter, the detached wafer parts are cooled down to room temperature $T_R$.

FIG. 4 shows a temperature-time diagram illustrating the temperature-time course according to a second embodiment of the present method in which the temperature is cooled after a first annealing step 21' directly to the temperature $T_1$ of the second annealing step 22.

FIG. 5 shows a temperature-time diagram illustrating the temperature-time course according to a third embodiment of the present method in which the temperature is reduced in a step-wise manner during the first annealing step. In the third embodiment, the wafer structure 12 is heated in the first annealing step 21 from room temperature $T_R$ to a value $T_0$, is further held constant at this temperature $T_0$ of about 425° C. for several minutes, and is then cooled over several temperature steps $T_2,T_3,T_4$ down to room temperature $T_R$. In the example shown, the wafer structure 12 is first cooled to a temperature $T_2$ which is about 20° to 30° lower than temperature $T_0$. The wafer structure 12 is held constant at this temperature $T_2$ for a couple of minutes. Thereafter, the wafer structure 12 is cooled down to a temperature $T_3$ which is an additional 20° to 30° lower than temperature $T_2$. After a few minutes, the wafer compound is further continuously cooled down to a temperature $T_4$ of about 350° C. where it is held constant for several minutes and is then cooled down to room temperature $T_R$.

The energy applied to the wafer structure 12 during the first annealing step 21 corresponds to about 90% of the thermal detachment budget of the wafer compound 12 that would result in detachment.

In the second annealing step 23, which follows the first annealing step 21, the wafer structure 12 is heated from room temperature $T_R$ to a temperature $T_5$ of about 300° C. where it is held constant for about 60 to 80 minutes until detachment occurs. The energy applied to the wafer structure in the second annealing step 23 corresponds to about 10% of the thermal detachment budget. The detachment point is marked with an arrow E.

In another embodiment of the invention (not shown), the second annealing step 23 can be stopped before detachment occurs. Then, an additional amount of energy is applied to the wafer compound 12. The additional energy may be provided in any form, such as mechanical energy, radiation or acoustic energy, which leads to splitting of the wafer compound 12. This energy is much less than that which would otherwise be needed if the two annealing steps were not conducted.

After detachment, the heterostructure 8 and the remainder 4 of the source wafer 1 generally are cooled down to room temperature $T_R$.

As indicated by dotted line 3' in FIG. 5, in another embodiment, the wafer structure 12 can be held constant at the temperature $T_5$ for longer than 80 minutes, even up to about 160 to 200 minutes. In FIG. 5, the subsequent steps in which the temperature is reduced in a stepwise manner enables a reduction of the duration of the last step where thermal detachment occurs. This variant optimizes the pre-weakening step. It can be applied to the first and/or the second annealing steps 21, 23.

In the following, the function and the effect of the embodiments shown are explained.

With reference to FIG. 3, in the first annealing step 21, a relatively high temperature $T_0$ is applied for a relatively short time. The annealing temperature and annealing time corresponds to about 90% of the thermal budget of the bonded wafer structure. At a thermal budget $T_0$, $t_0$ an initial thermal energy can be applied to the wafer structure, to pre-weaken the pre-determined buried detachment area in the source wafer 1 of the wafer structure, which forms the basis for a later detachment phenomenon. The second annealing step 22 is performed after the first one and at a much lower temperature than that used during the first annealing step 21. The optimization of pre-weakening can occur not only in the first annealing step but also in the second annealing step.

Referring again to FIG. 3, the temperature of the first annealing step 21 is about 400° C. to 450° C. whereas the temperature of the second annealing step 22 is below 400° C. The induced thermal energy during the second annealing step helps to detach the wafer compound into two wafer parts along the predetermined detachment area 5. This results in a SOQ wafer 8 consisting of the quartz substrate 2 and a thin silicon layer 3 thereon or in a SOI wafer consisting of a silicon substrate and a thin silicon layer thereon.

With reference to FIG. 4, where nearly the same annealing temperatures and annealing times are used as in the first embodiment shown in FIG. 3, the temperature between the first annealing step 21' and the second annealing step 22 is cooled down to the temperature $T_1$ of the second annealing step 22. The annealing steps 21', 22 may be performed in the same furnace 7. This shortens the transition time from the first annealing step 21' to the second annealing step 22 and therefore reduces the entire processing time.

As shown in FIG. 5, the annealing time of the second annealing step 23 can be shortened by rapidly heating the wafer structure 12 in the first annealing step 21 to a temperature $T_0$ of about 425° C., and a reducing the temperature in a step-wise manner at certain temperature levels $T_2, T_3, T_4$. The thermal energy applied to the structure of the wafer structure 12 in the two annealing steps 21, 23 corresponds to 100% of the thermal detachment budget of the wafer structure 12, so that after a certain period of time at the temperature $T_5$ of the second annealing step 23 thermal detachment of the wafer structure in the area 5 can be achieved.

The stepwise reduction of the temperature in the first annealing step 21 also can lead to a pre-weakening to attain an easier detachment in the second annealing step 23. Instead of the temperature profile shown in FIG. 5, any other favorable temperature profile can be used for detachment of the wafer structure 12.

Moreover, it is possible to change the temperature in the first annealing step 21 so that the temperature difference between the temperature steps $T_0, T_2, T_3,$ or $T_4$ rises. For instance, the temperature can be reduced from $T_0$ to $T_3$ and thereafter can be further enhanced to $T_2$ and then again reduced to $T_3$ and to $T_R$.

Furthermore, it is possible to combine the first and the second annealing steps into one annealing step in which the temperature between the two annealing steps is not reduced to room temperature $T_R$.

It should be further taken into consideration that the above-mentioned annealing times and annealing temperatures are favorably related to detachment of wafer structures consisting of silicon and fused silica with conventional thicknesses, warps and thermal features. When other substrates with other features or different implantation conditions are used, it should be understood that the given times and temperatures are to be adapted accordingly.

What is claimed is:

1. A method for manufacturing a semiconductor structure comprising:
providing a predetermined detachment area in a source substrate of a first material;
bonding the source substrate to a handle substrate of a second material to form a source-handle-structure;
annealing the source-handle-structure in multiple annealing steps with a first annealing step conducted at a first energy level which is lower than the energy of a thermal detachment budget, and a second annealing step conducted at a second energy level that is lower than the first energy level to at least prepare at least the source substrate for detachment of a useful layer at the predetermined detachment area in order to obtain a layer of first material supported by handle substrate.

2. The method according to claim 1, wherein the second annealing step is conducted until detachment occurs at the predetermined detachment area to provide the useful layer on the handle substrate.

3. The method according to claim 1, which further comprises detaching the useful layer at the predetermined detachment area by providing additional energy to the source substrate.

4. The method according to claim 3, wherein the additional energy is thermal energy provided by further heating of the source substrate.

5. The method according to claim 3, wherein the additional energy is mechanical energy applied to or near the predetermined detachment area of the source substrate.

6. The method according to claim 1, wherein the first annealing step provides about 70 to 99% of the energy of the thermal detachment budget.

7. The method according to claim 1, wherein the first annealing step includes heating to a temperature of about 350° C. to 500° C. for about a few minutes to about a few hours.

8. The method according to claim 7, wherein the second annealing step includes heating to a temperature of about 150° C. to 350° C. for about a few hours to about a few days, with the temperature of the first annealing step being at least 25% greater than that of the second annealing step, and the second annealing step is conducted for at least twice as long as the first annealing step.

9. The method according to claim 1, wherein annealing at the second energy level includes heating at about 150° C. to 350° C. for about a few hours to about a few days.

10. The method according to claim 1, further comprising cooling the source-handle-structure between the first and second annealing steps.

11. The method according to claim 10, wherein the source-handle-structure is cooled to a temperature of between about 18° C. and 25° C.

12. The method according to claim 10, wherein the source-handle-structure is cooled to the temperature of the second annealing step.

13. The method according to claim 1, wherein the first annealing step includes step-wise heating or cooling to gradually increase or decrease heating temperature.

14. The method according to claim 13, wherein the stepwise heating in the first annealing step increases the time necessary to complete that step but decreases the time necessary to complete the second annealing step.

15. The method according to claim 13, wherein the first annealing step includes heating to a maximum temperature followed by step wise cooling to lower temperatures.

16. The method according to claim 10, wherein the temperature of the first annealing step is cooled to the temperature of the second annealing step.

17. The method according to claim 1, wherein the predetermined detachment area is made by implantation of hydrogen ions, rare gas ions or a combination of hydrogen and rare gas ions to form a zone of weakness that corresponds to the detachment area.

18. The method according to claim 17, wherein the predetermined detachment area is made by implantation of hydrogen ions, helium ions or a combination of hydrogen and helium ions.

19. The method according to claim 1, further comprising cooling the layer of first material and handle structure to room temperature after the second annealing step.

20. The method according to claim 1, wherein the second material of the handle substrate is different from the first material of the source substrate.

21. The method according to claim 1, wherein the first and second materials are at least one of silicon, a group (III)-(V) semiconductor, an alloy of a group (III)-(V) semiconductor, silicon germanium, silicon carbide, synthetic quartz or fused silica.

22. The method according to claim 1, wherein the first and second materials form or comprise a heterogenous semiconductor structure.

23. The method according to claim 22, wherein the source substrate is a silicon wafer and the handle substrate is a wafer of fused silica or synthetic quartz.

* * * * *